United States Patent
Dujardin et al.

(10) Patent No.: US 6,792,060 B1
(45) Date of Patent: Sep. 14, 2004

(54) PROCESSOR HAVING AN ADAPTABLE OPERATIONAL FREQUENCY

(75) Inventors: Eric Dujardin, Paris (FR); Olivier Gay-Bellile, Paris (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/568,284

(22) Filed: May 10, 2000

(30) Foreign Application Priority Data

May 11, 1999 (FR) .......................................... 99 06019

(51) Int. Cl.[7] ................................................ H04L 7/00
(52) U.S. Cl. ...................... 375/355; 370/503; 327/154; 327/162
(58) Field of Search ................................. 375/354, 355, 375/344; 341/123; 370/503, 505, 520, 521; 327/141, 154, 155, 160, 162

(56) References Cited

U.S. PATENT DOCUMENTS

| | | | |
|---|---|---|---|
| 4,298,985 A | * 11/1981 | Ballard et al. | .............. 375/328 |
| 4,612,573 A | * 9/1986 | Grallert et al. | ............. 348/441 |
| 4,617,599 A | 10/1986 | Noguchi et al. | ............... 360/32 |
| 4,797,845 A | * 1/1989 | Stikvoort | ..................... 708/313 |
| 5,317,602 A | * 5/1994 | Onoda et al. | ................ 375/371 |

FOREIGN PATENT DOCUMENTS

EP  0 512 619 A1 * 11/1992

* cited by examiner

*Primary Examiner*—Stephen Chin
*Assistant Examiner*—Dac V. Ha
(74) *Attorney, Agent, or Firm*—Peter Zawilski

(57) ABSTRACT

The invention relates to a processing device for digital data which is capable of processing data which have been sampled with a sampling clock which may have any value whatsoever with respect to the basic clock of the device. To achieve this, the device is provided with means for generating from its basic clock an operational clock which is a function of the sampling clock of the data to be processed. This operational clock has a constant integer number of active periods during one cycle of the sampling clock. Application: Digital communication systems, especially demodulation.

15 Claims, 1 Drawing Sheet

PROCESSOR HAVING AN ADAPTABLE OPERATIONAL FREQUENCY

FIELD OF THE INVENTION

The invention relates to a communication system comprising at least a transmitter and a receiver, which receiver comprises:
an analog/digital converter for sampling an input signal at a frequency supplied by a sampling clock,
a processor for processing sampled data at a frequency provided by an operational clock,
a clock generator for generating said operational clock as a function of the sampling clock.
The invention also relates to:
a receiver, and
a processing device for digital data which were previously sampled at a frequency provided by a sampling clock, which device comprises a clock generator for generating an operational clock, which is to be used for processing said data, as a function of said sampling clock.

BACKGROUND OF THE INVENTION

U.S. Pat. No. 4,617,599 describes an electronic equipment provided with a processor for handling digital data. This processor is capable of processing data sampled with a frequency which forms part of a finite set of given frequencies. The solution proposed in this document comprises the use of a specific local oscillator for each sampling frequency which can be handled by the processor. Each local oscillator generates a reference signal. A selection circuit selects a reference signal as a function of the sampling frequency of the data to be processed. The selected reference signal serves to produce the clock signal used by the processor for the data processing.

The invention has for its object to provide an operational clock for a processor for processing data which were sampled with a sampling clock whose frequency may have various values which are not necessarily known beforehand. Since the sampling frequencies which may be used are not known in advance, the solution proposed in the cited U.S. Pat. No. 4,617,599 is not applicable.

SUMMARY OF THE INVENTION

A communication system, a receiver, and a processing device according to the invention as described in the opening paragraphs are characterized in that said generator comprises means for generating said operational clock from a basic clock such that said operational clock has a constant integer number of active periods during one cycle of the sampling clock.

The invention thus consists in that an operational clock is generated from a single basic clock, the former having a constant relation with a sampling clock. In particular, this renders it possible for the processor to know when the sampled data are available in a time reference provided by its operational clock.

BRIEF DESCRIPTION OF THE DRAWINGS

The invention will be better understood and further details will become apparent from the following description with reference to the annexed drawings which are given by way of non-limitative example and in which.

DESCRIPTION OF PREFERRED EMBODIMENT

Figure 1:
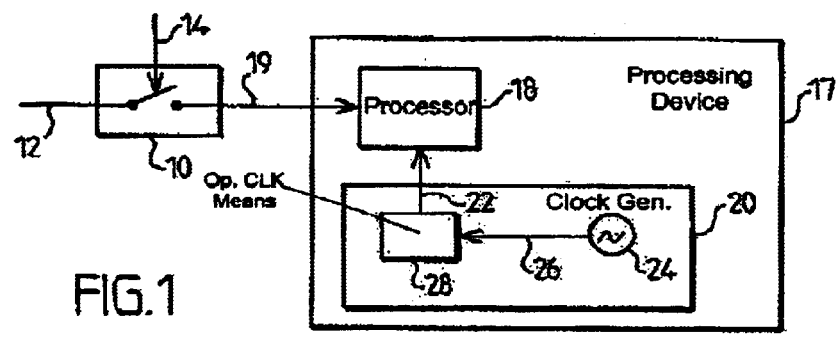
FIG. 1 shows a receiver according to the invention.

FIG. 1 shows an example of a receiver according to the invention. This receiver comprises an analog/digital converter 10 for sampling an input signal 12 with a frequency provided by a sampling clock 14. It also comprises a processing device 17. This processing device 17 in particular comprises a processor 18 for processing the sampled data 19 and a clock generator 20 which generates an operational clock 22 for the processor 18. This operational clock 22 operates as a function of the sampling clock with which the data to be processed have been sampled. According to the invention, the clock generator 20 comprises a local oscillator 24 which provides a basic clock 26 and means 28 for generating the operational clock 22 from this basic clock 26 such that the operational clock 22 has a constant integer number of active periods during one cycle of the sampling clock 14 (throughout the description, the term "active period" is understood to mean the time space during which the level of the operational clock is active within one cycle of the operational clock).

The invention renders it possible to establish a relation between the operational clock 22 of the processor 18 and the sampling clock 14 for the data to be processed, irrespective of what this sampling clock may be. Thanks to this constant relation, the processor 18 knows that it receives a sampled data during each of the n active periods of its operational clock 22. This serves to ensure a synchronization between the sampling clock 14 and the operational clock 22.

Figure 2:
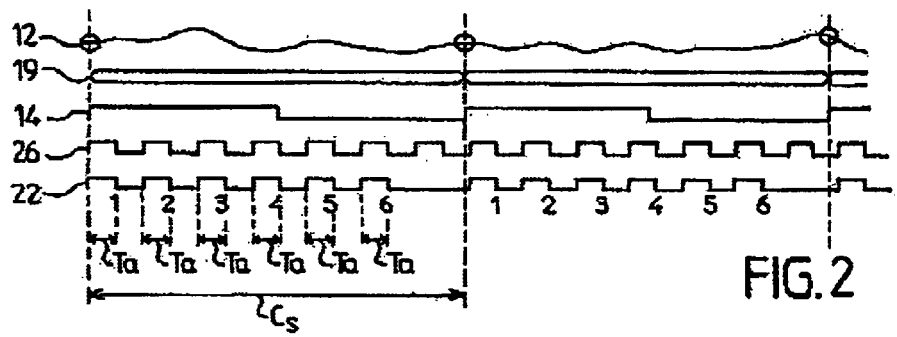
FIG. 2 is a diagram showing the various signals used in a system according to the invention.

FIG. 2 is a diagram showing the various signals used in a system according to the invention: the analog input signal 12, the sampled data 19, the sampling clock 14, the basic clock 26, and the operational clock 22. As is apparent from FIG. 2, there is no relation between the basic clock 26 and the sampling clock 14. The invention renders it possible to generate from these two clocks 14 and 26 an operational clock 22 which does have a constant relation with the sampling clock 14. According to the invention, the operational clock 22 has a constant integer number n of active periods $T_a$ during one cycle $C_s$ of the sampling clock 14. The integer number n is defined, for example, in the following way: $n=E(F_b/F_s)$, where E is the mathematical function of integer part, $F_b$ is the frequency of the basic clock 26, $F_s$ is the frequency of the sampling clock 14, and n is a constant integer number. FIG. 2 shows the case in which n=6 by way of example.

The processor 18 is, for example, a programmable processor designed for use in demodulation applications in a broadcasting system for digital TV programs of the type as defined in the DVB (Digital Video Broadcasting) standardization projects of the ETSI. Let us suppose that:
the basic clock of the processor is set for 130 MHz,
the sampling frequency used in a demodulator for a satellite broadcasting system is equal to 65 MHz, and
the sampling frequency used in a demodulator for a cable distribution system is 28.92 MHz, then the operational clock of the processor comprises n=2 active periods during a cycle of the sampling clock in the case of the satellite, and n=4 active periods during a cycle of the sampling clock in the case of the cable.

Figure 3:
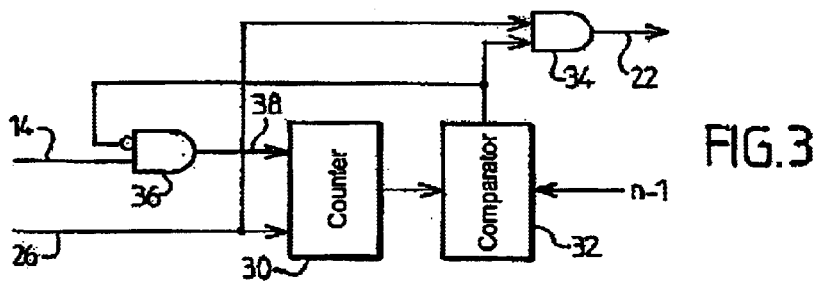
FIG. 3 is a diagram of an embodiment of a clock generator according to the invention.

FIG. 3 shows an example of an embodiment of the clock generator 20. The clock generator 20 of FIG. 3 comprises a counter 30, a comparator 32, and two logic gates 34 and 36 which are AND gates. The gate 34 receives at its input the basic clock 26 and the output of the comparator 32. It supplies at its output the operational clock 22. The gate 36 receives at its input the sampling clock 14 and the inverted output signal of the comparator 32. It supplies a reset signal 38 for the counter 30. The counter 30 counts the active rising edges of the basic clock 26. The counter 30 is reset when the sampling clock 14 is at its active level, upon the first rising edge of the basic clock. This means that the $n^{th}$ active rising edge of the basic clock corresponds to a value n−1 of the counter 30.

The comparator 32 compares the output signal of the counter 30 with the value n−1 (which is programmed as a function of the frequency $F_b$ of the basic clock 26 and the sampling frequency $F_s$). When the counter arrives at n−1, the output 40 of the comparator 32 is deactivated. The operational clock 22 is maintained at its inactive level until the sampling clock 14 passes to its active level and a rising edge of the basic clock 26 appears.

In the example described here, the active edges are rising edges, the active levels are high levels, and the inactive levels are low levels.

Figure 4:
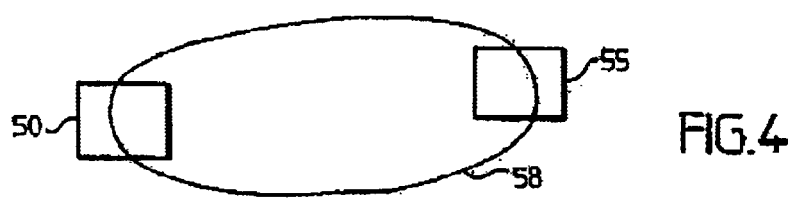
FIG. 4 is a diagram of a communication system according to the invention.

FIG. 4 shows a diagram of a communication system according to the invention. This communication system comprises a transmitter 50, a receiver 55, and a transmission medium 58. The receiver 55 is of the type as shown in FIG. 1. The transmission medium may be of various kinds. It may be, for example, a cable transmission, a satellite link, or a radio wave transmission.

What is claimed is:

1. A communication system comprising at least a transmitter and a receiver, which receiver comprises:

an analog/digital converter for sampling an input signal at a frequency supplied by a sampling clock, a processor for processing sampled data at a frequency provided by an operational clock, a clock generator for generating said operational clock as a function of the sampling clock, wherein said clock generator comprises means for generating said operational clock from a basic clock such that said operational clock has a constant integer number (n) of active periods (Ta) during one cycle of the sampling clock; and wherein the clock generator further comprises means for determining said integer number from the integer part of the ratio between the frequencies of the basic clock (Fb) and the sampling clock (Fs).

2. The communication system of claim 1, wherein the means for determining said integer number comprises:

a counter, the counter having reset input terminal, and a clock input terminal, the counter configured to provide a counter output;

a reset signal source coupled to the reset input terminal; and a comparator coupled to receive the counter output from the counter;

wherein the counter is configured to count the number of rising edges at the clock input terminal, and wherein the comparator is configured to compare the counter output to a predetermined value.

3. The communication system of claim 2, wherein the basic clock is coupled to the clock input terminal of the counter.

4. The communication system of claim 3, wherein the reset signal source is coupled to receive an output from the comparator.

5. The communication system of claim 4, wherein the reset signal source is coupled to receive the sampling clock.

6. A receiver comprising at least:

an analog/digital converter for sampling an input signal at a frequency supplied by a sampling clock, a processor for processing sampled data at a frequency provided by an operational clock, a clock generator for generating said operational clock as a function of the sampling clock, characterized in that said clock generator comprises means for generating said operational clock from a basic clock such that said operational clock has a constant integer number (n) of active periods (Ta) during one cycle of the sampling clock; wherein the clock generator further comprises means for determining said integer number from the integer part of the ratio between the frequencies of the basic clock (Fb) and the sampling clock (Fs).

7. The receiver of claim 6, wherein the means for determining said integer number comprises:

a counter, the counter having reset input terminal, and a clock input terminal, the counter configured to provide a counter output;

a reset signal source coupled to the reset input terminal; and a comparator coupled to receive the counter output from the counter;

wherein the counter is configured to count the number of rising edges at the clock input terminal, and wherein the comparator is configured to compare the counter output to a predetermined value.

8. The receiver of claim 7, wherein the basic clock is coupled to the clock input terminal of the counter.

9. The receiver of claim 8, wherein the reset signal source is coupled to receive an output from the comparator.

10. The receiver of claim 9, wherein the reset signal source is coupled to receive the sampling clock.

11. A processing device for digital data which were previously sampled at a frequency provided by a sampling clock, which device comprises a clock generator for generating an operational clock, which is to be used for processing said data, as a function of said sampling clock, characterized in that said clock generator comprises means for generating said operational clock from a basic clock such that said operational clock has a constant integer number (n) of active periods (Ta) during one cycle (Cs) of the sampling clock; and the processing device further characterized in that the clock generator comprises means for determining said integer number from the integer part of the ratio between the frequencies of the basic clock (Fb) and the sampling clock (Fs).

12. The processing device of claim 11, wherein the means for determining said integer number comprises:

a counter, the counter having reset input terminal, and a clock input terminal, the counter configured to provide a counter output;

a reset signal source coupled to the reset input terminal; and a comparator coupled to receive the counter output from the counter;

wherein the counter is configured to count the number of rising edges at the clock input terminal, and wherein the comparator is configured to compare the counter output to a predetermined value.

13. The processing device of claim 12, wherein the basic clock is coupled to the clock input terminal of the counter.

14. The processing device of claim 13, wherein the reset signal source is coupled to receive an output from the comparator.

15. The processing device of claim 14, wherein the reset signal source is coupled to receive the sampling clock.

* * * * *